United States Patent
Lv et al.

(10) Patent No.: US 12,124,945 B2
(45) Date of Patent: Oct. 22, 2024

(54) NEURAL NETWORK OPERATION DEVICE

(71) Applicant: INSTITUTE OF MICROELECTRONICS, CHINESE ACADEMY OF SCIENCES, Beijing (CN)

(72) Inventors: Hangbing Lv, Beijing (CN); Xiaoxin Xu, Beijing (CN); Qing Luo, Beijing (CN); Ming Liu, Beijing (CN)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 709 days.

(21) Appl. No.: 17/310,203

(22) PCT Filed: Jan. 28, 2019

(86) PCT No.: PCT/CN2019/073420
§ 371 (c)(1),
(2) Date: Jul. 26, 2021

(87) PCT Pub. No.: WO2020/154839
PCT Pub. Date: Aug. 6, 2020

(65) Prior Publication Data
US 2022/0172035 A1    Jun. 2, 2022

(51) Int. Cl.
*G06N 3/065*     (2023.01)
*G11C 11/22*     (2006.01)
(Continued)

(52) U.S. Cl.
CPC ............ *G06N 3/065* (2023.01); *G11C 11/223* (2013.01); *G11C 11/2273* (2013.01);
(Continued)

(58) Field of Classification Search
CPC ... G06N 3/065; G11C 11/223; G11C 11/2273; G11C 11/54; G11C 11/2275;
(Continued)

(56) References Cited

U.S. PATENT DOCUMENTS 9,934,838 B1 *   4/2018   Han ................... G11C 13/004
10,534,840 B1 *   1/2020   Petti ...................... G11C 11/54
(Continued)

FOREIGN PATENT DOCUMENTS

CN     1376311 A     10/2002
CN    101740616 A     6/2010
(Continued)

OTHER PUBLICATIONS

Chinese Search Report for PCT/CN2019/073420 dated Jul. 3, 2019, 12 pages, with English translation.

*Primary Examiner* — S M Sohel Imtiaz
(74) *Attorney, Agent, or Firm* — Christopher R. Christenson; Kelly, Holt & Christenson, P.L.L.C.

(57) ABSTRACT

Disclosed is a neural network operation device, including: an operation array including operation units, wherein each operation unit includes: a source terminal, a drain terminal, a gate electrode, a threshold voltage adjustment layer under the gate electrode, and a channel region extending between a source region and a drain region, the threshold voltage adjustment layer is located on the channel region. The gate electrodes of each column of operation units of the operation array are connected together, and each column is used to adjust a weight value according to a threshold voltage adjusted by the threshold voltage adjustment layer. The threshold voltage adjustment layer is a ferroelectric layer.

9 Claims, 11 Drawing Sheets

(51) Int. Cl.
*G11C 11/54* (2006.01)
*H01L 29/51* (2006.01)
*H01L 29/78* (2006.01)

(52) U.S. Cl.
CPC ............ *G11C 11/54* (2013.01); *H01L 29/516* (2013.01); *H01L 29/78391* (2014.09)

(58) Field of Classification Search
CPC . H01L 29/516; H01L 29/78391; H10B 43/30; H10B 51/30
See application file for complete search history.

(56) References Cited

U.S. PATENT DOCUMENTS

| | | | | |
|---|---|---|---|---|
| 2006/0223248 | A1* | 10/2006 | Venugopal | H01L 29/7838 257/E21.639 |
| 2015/0178619 | A1* | 6/2015 | Nishitani | G06N 3/063 706/26 |
| 2015/0269483 | A1* | 9/2015 | Nishitani | G06N 3/065 706/25 |
| 2016/0093707 | A1* | 3/2016 | Ryu | H01L 29/66825 438/257 |
| 2019/0057308 | A1* | 2/2019 | Cho | G06N 3/065 |
| 2019/0096463 | A1* | 3/2019 | Han | G11C 11/2255 |
| 2019/0108434 | A1* | 4/2019 | Wozniak | G06N 3/049 |

FOREIGN PATENT DOCUMENTS

| | | | | |
|---|---|---|---|---|
| CN | 102122105 | A | 7/2011 | |
| CN | 106537509 | A | 3/2017 | |
| CN | 106887432 | A | 6/2017 | |
| CN | 106910773 | A | 6/2017 | |
| CN | 108091693 | A | 5/2018 | |
| CN | 108154226 | A | 6/2018 | |
| CN | 110189777 | B | * 2/2024 | ........... G11C 11/221 |

\* cited by examiner

NEURAL NETWORK OPERATION DEVICE

CROSS REFERENCE

The application is a Section 371 National Stage Application of International Application No. PCT/CN2019/073420, filed on Jan. 28, 2019, entitled "NEURAL NETWORK OPERATION SYSTEM", the content of which is incorporated herein by reference in its entirety.

TECHNICAL FIELD

The present disclosure relates to a field of neural network operation, and further relates to a neural network operation device that integrates storage and operation functions.

BACKGROUND

A traditional DRAM (Dynamic Random Access Memory) is implemented by using a 1 T1C (1 Transistor-1 Capacitor) memory cell structure. When a word line connected to a gate electrode of the transistor is gated, the transistor is gated, and bit information stored on the capacitor may be read from a bit line. A traditional NAND is implemented by using a floating gate or a charge trapping structure. One of them is to achieve a dynamic random storage, and the other is to achieve a non-volatile storage. These two types of memories are greatly different in preparation process and may not be integrated in a system on chip (SOC). Therefore, advantages of the two types of memories may not be integrated, which limits storage capacity and computing performance of the SOC.

In a neural network, a traditional synapse device is simulated by a two-terminal memristor or a three-terminal transistor. The synapse devices are generally connected to each other in a parallel NOR structure. After weight training, the operation may be performed by way of current convergence. This type of structure has problems of large operating current and large training consumption, which limits the number of parallels.

SUMMARY

The present disclosure provides a neural network operation device, including:
  an operation array including operation units, wherein each operation unit includes: a source terminal, a drain terminal, a gate electrode, a threshold voltage adjustment layer under the gate electrode, and a channel region extending between a source region and a drain region, the threshold voltage adjustment layer is located on the channel region;
  wherein the gate electrodes of each column of operation units of the operation array are connected together, and each column is configured to adjust a weight value according to a threshold voltage adjusted by the threshold voltage adjustment layer; and
  wherein the threshold voltage adjustment layer is a ferroelectric layer.

In a further embodiment, the gate electrodes of each column of operation units of the operation array are configured to input a value for operation, the operation units in each row of the operation array are connected in series, and each row of operation units is configured to output an output value generated by operations of the operation units in each row.

In a further embodiment, each row of operation units are further connected in series with a summation circuit, the summation circuit is configured to sum operation results of each operation unit, so as to form an output voltage value.

In a further embodiment, each row of summation circuits further includes an analog-to-digital conversion circuit at a back end, and the analog-to-digital conversion circuit is configured to convert the output voltage value into an output value of a corresponding digital signal.

In a further embodiment, a material of the ferroelectric layer contains doped $HfO_x$, $ZrO_x$, PZT, BFO or BST.

In a further embodiment, each operation unit in the operation array is constructed in a 3D stacking manner.

In a further embodiment, each row of operation units in the operation array are connected in series, wherein voltages are respectively input in a set row and a set column of the operation array so as to jointly determine a threshold voltage of the operation unit in the set row and the set column.

In a further embodiment, an absolute value of a voltage applied to the gate electrode of each operation unit is configured to be greater than an inversion voltage enabling a polarization inversion of the ferroelectric layer.

In a further embodiment, the neural network operation device further includes: a control circuit electrically connected to the operation array and configured to control a weight writing, a neural network operation, and/or an output of a neural network operation result in the operation array.

In a further embodiment, the neural network operation device further includes: a read circuit configured to read the neural network operation result.

DETAILED DESCRIPTION OF EMBODIMENTS

Figure 1:
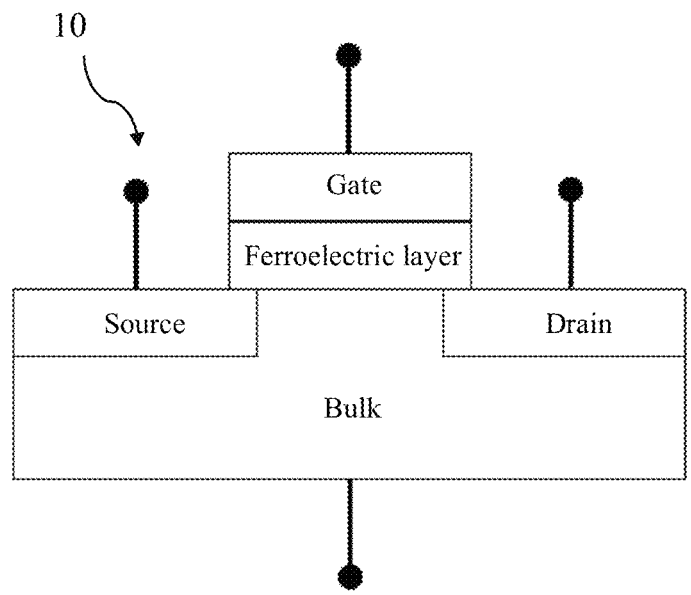
FIG. 1 is a schematic cross-sectional view of a memory cell in a fusion memory according to some embodiments of the present disclosure.

In order to make objectives, technical solutions and advantages of the present disclosure more apparent, the present disclosure will be further described in detail below in combination with specific embodiments and with reference to the drawings. Hereinafter, some embodiments will be provided to illustrate the solutions of the present disclosure in detail. The advantages and effects of the present disclosure will become more apparent through the following content of the present disclosure. It should be noted that the accompanying drawings are simplified and used as examples. Numbers, shapes and sizes of components shown in the drawings may be adjusted according to actual conditions, and configurations of the components may be more complicated. Other aspects of practices or applications may also be carried out in the present disclosure, and various changes and adjustments may be made without departing from the spirit and scope defined in the present disclosure.

The terms "on", "above", "under", and so on in the present disclosure, unless otherwise specified, mean that a semiconductor layer structure in the memory is located on, or under another semiconductor layer structure in a direct contact manner. That is to say, when "on" or "under" is used for description, two semiconductor layers are in direct contact. For example, "a ferroelectric layer is located on a channel region" means that the ferroelectric layer is located on the channel region in a direct contact manner. The "bulk" mentioned in the present disclosure refers to a substrate or a well material that may participate in a formation of one or more memory cells.

According to one aspect of the embodiments of the present disclosure, there is provided a fusion memory including a plurality of memory cells. Each memory cell includes a ferroelectric layer that enables the memory cell to operate in a charge trapping mode and a polarization inversion mode. Therefore, the memory combines functions of DRAM and NAND and integrates advantages of both.

FIG. 1 is a schematic cross-sectional view of a memory cell in a fusion memory according to some embodiments of the present disclosure. FIG. 1 shows a fusion memory including a plurality of memory cells 10. Each memory cell 10 includes: a bulk substrate; a source electrode and a drain electrode as well as a channel region extending between a source region and a drain region, that are located on the bulk substrate; a ferroelectric layer on the channel region; and a gate electrode on the ferroelectric layer.

The memory cell in this embodiment includes the channel region and the ferroelectric layer on the channel region, which are in direct contact. By adjusting a voltage applied to the gate electrode, the ferroelectric layer may operate in a charge trapping mode and a polarization inversion mode.

The ferroelectric layer in FIG. 1 is used as a gate dielectric between the gate electrode and the channel region. The memory may operate in two modes. On one hand, a large number of lattice defects in a ferroelectric material are used for charge storage, so that the memory may operate in the charge trapping mode, and data may be stored by trapping and releasing charges. On the other hand, the memory may also operate in the ferroelectric inversion mode, and data may be stored through polarization inversion.

In some embodiments, the material of the ferroelectric layer may contain doped $HfO_x$, $ZrO_x$, PZT, BFO or BST, preferably $HfO_x$. A dopant may be Si, Zr, Hf, Al, Y, Gd, La, Sr, Ti, and/or N, etc., preferably Zr. A doping content is between 10% and 75%.

In some embodiments, the ferroelectric layer has a thickness of 3 nm to 10 nm. The channel has a length of 5 nm to 200 nm and a width of 5 nm to 500 nm.

In some embodiments, the bulk, the source electrode, the drain electrode and the gate electrode may be configured according to existing memory cell arrangements, and a corresponding preparation process may also be performed with reference to existing process flows and participations.

In some embodiments, the fusion memory further includes a control circuit, and a gate control sub-circuit connected to each memory cell and configured to separately apply a specific first voltage to the gate electrode, so that the ferroelectric layer under the gate electrode may trap electrons, and a threshold voltage is changed during charging or discharging. The control circuit may also be integrated in a read-write circuit of the memory so as to control a corresponding voltage pulse value during the read-write process. The read-write circuit may write content into an accessed memory cell at a first voltage or read information from the accessed memory cell according to a read-write instruction of a CPU. An absolute value of the first voltage should be smaller than a inversion voltage value that enables the polarization inversion of the ferroelectric material in the ferroelectric layer. With an increase of the first voltage, the ferroelectric layer traps more electrons, and the threshold value of the memory cell may gradually increase.

In some embodiments, the control circuit is further used to separately apply a specific second voltage to the gate electrode, so as to enable a polarization inversion of the gate charges, which may change the threshold voltage accordingly. The threshold voltage gradually decreases with the increase of the second voltage. The read-write circuit may write the content into the accessed memory cell at the second voltage or read information from the accessed memory cell according to the read-write instruction of the CPU. An absolute value of the second voltage should be greater than a inversion voltage value that enables the polarization inversion of the ferroelectric material in the ferroelectric layer.

In some embodiments, according to requirements of a memory product, the source region and the drain region may be kept in a floating state, or adjusted to a corresponding state (positive voltage, negative voltage, or grounding) according to an operating state (writing, erasing, or reading) of the memory. The specific adjustment manner may refer to the following embodiment of the writing method for the fusion memory.

In some embodiments, in a specific program, the control circuit described above may control the voltage applied to the gate electrode to be at the first voltage or the second voltage, that is, two voltage modes may appear in one process, which may give play to respective advantages of DRAM and traditional flash.

In some embodiments, a memory cell array of the fusion memory of the embodiments of the present disclosure may be configured by using word line, bit line and source line architecture known in the related art. The word line is coupled to the gate electrode of the corresponding memory cell, the bit line is coupled to the drain electrode of the corresponding memory cell, and the source line is coupled to the source electrode of the corresponding memory cell.

In some embodiments, the fusion memory of the present disclosure further includes a read circuit used to read the information stored in each memory cell. The read circuit may read the information stored in the memory cell by applying a small reading voltage (for example, 0.6V) in the polarization inversion mode or the charge trapping mode of the ferroelectric layer.

Figure 2:
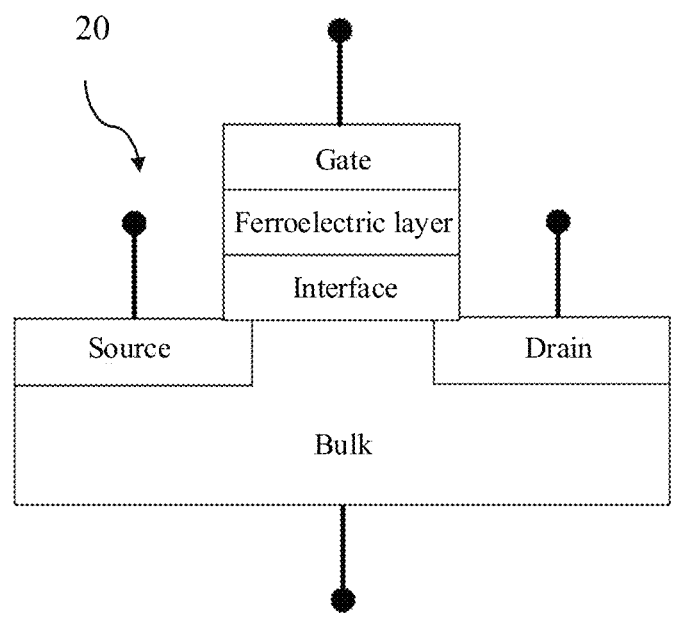
FIG. 2 is a schematic cross-sectional view of a memory cell in another fusion memory according to some embodiments of the present disclosure.

FIG. 2 is a schematic cross-sectional view of a memory cell in another fusion memory according to some embodiments of the present disclosure. FIG. 2 shows a fusion memory including a plurality of memory cells 20. Each memory cell 20 includes: a bulk substrate; a source electrode and a drain electrode as well as a channel region extending between a source region and a drain region, that are located on the bulk substrate; a first interface layer on the channel region; a ferroelectric layer on the first interface layer; and a gate electrode on the ferroelectric layer.

The memory cell in this embodiment has a structure similar to that in FIG. 1, except that the first interface layer is provided between the ferroelectric layer and the channel region. The first interface layer may be used to control a growth of the ferroelectric material, such as lattice orientation control or defect distribution.

In some embodiments, a material of the first interface layer may contain $SiO_2$, SiN, SiON, $AlO_x$, $TiO_2$ or $HfO_x$. Preferably, the material of the first interface layer may contain $SiO_2$. The first interface layer may have a thickness of 0.3 nm to 3 nm. The material of the first interface layer may be adjusted according to the ferroelectric layer material to be grown. For example, when the ferroelectric layer material contains $HfO_x$, the corresponding first interface layer material may contain SiON. For another example, when the ferroelectric layer material contains SBT, the corresponding first interface layer material may contain $HfO_x$ or $AlO_x$.

Figure 3:
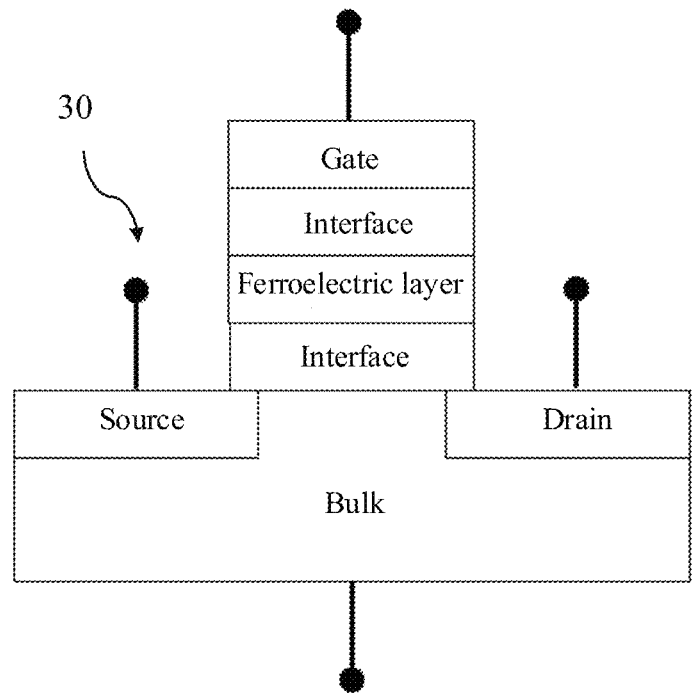
FIG. 3 is a schematic cross-sectional view of a memory cell in yet another fusion memory according to some embodiments of the present disclosure.

FIG. 3 is a schematic cross-sectional view of a memory cell in another fusion memory according to some embodiments of the present disclosure. FIG. 3 shows a fusion memory including a plurality of memory cells 30. Each memory cell 30 includes: a bulk substrate; a source electrode and a drain electrode as well as a channel region extending between a source region and a drain region, that are located on the bulk substrate; a first interface layer on the channel; a ferroelectric layer on the first interface layer; a second interface layer on the ferroelectric layer; and a gate electrode on the second interface layer.

The memory cell in this embodiment has a structure similar to that in FIG. 1, except that the first interface layer is provided between the ferroelectric layer and the channel region, and the second interface layer is provided between the ferroelectric layer and the gate electrode. The first interface layer may be used to control a growth of the ferroelectric material, such as lattice orientation control or defect distribution. The second interface layer is used to isolate a mutual diffusion and an interface damage between a metal gate and the ferroelectric layer.

In some embodiments, a material of the first interface layer may contain $SiO_2$, SiN, SiON, $AlO_x$, $TiO_2$, $HfO_x$ or a combination thereof. Preferably, the material of the first interface layer may contain $SiO_2$. The first interface layer may have a thickness of 0.3 nm to 3 nm. The material of the first interface layer may be adjusted according to the ferroelectric layer material to be grown. For example, when the ferroelectric layer material contains $HfO_x$, the corresponding first interface layer material may contain SiON. For another example, when the ferroelectric layer material contains SBT or PZT, the corresponding first interface layer material may contain $HfO_x$ or $AlO_x$.

In some embodiments, a material of the second interface layer may contain $SiO_2$, SiN, SiON, $AlO_x$, $TiO_2$ or $HfO_x$. Preferably, the material of the second interface layer may contain $AlO_x$. The second interface layer may have a thickness of 1 nm to 10 nm. The material of the second interface layer may be adjusted according to the material of the ferroelectric layer and the material of the gate electrode. For example, when the ferroelectric layer material contains $HfO_x$, the corresponding second interface layer material may be a $SiO_2/SiN/SiO_2$ stack. For another example, when the ferroelectric layer material contains SBT or PZT, the corresponding second interface layer material may contain $HfO_x$ or $AlO_x$.

Figure 4:
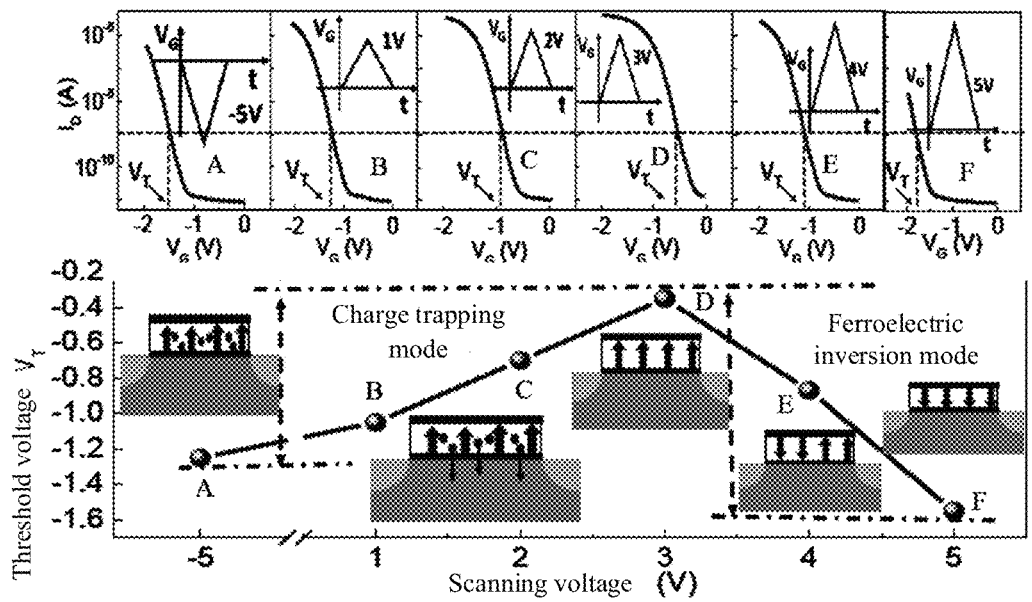
FIG. 4 is a schematic diagram of a principle of a fusion memory according to some embodiments of the present disclosure.

The operation principle of the memory cell in the fusion memory of the above embodiments may be referred to as shown in FIG. 4.

FIG. 4 is a schematic diagram of a principle of a fusion memory according to some embodiments of the present disclosure. As shown in FIG. 4, in the charge trapping mode, when a gate voltage $V_G$ gradually increases, a threshold voltage $V_T$ also gradually increases. At point A, the scanning voltage is $-5V$, and the corresponding threshold voltage $V_T$ is about $-1.5V$. When the scanning voltage gradually increases and turns to a positive value, such as 1V at point B, the threshold voltage $V_T$ is about $-1.1V$, which is increased compared with that at point A, similarly, at point C and point D, the memory is in the charge trapping mode. When the voltage increases to 4V, the voltage exceeds an inversion voltage that enables the ferroelectric inversion in the ferroelectric layer. Then, the ferroelectric reversal is generated and the threshold voltage decreases. When the scanning voltage is further increased, the threshold voltage $V_T$ gradually decreases, and the memory enters the ferroelectric inversion mode.

According to another aspect of the embodiments of the present disclosure, there is further provided a writing method for a fusion memory including a plurality of memory cells. Each memory cell includes: a bulk substrate; a source electrode, a drain electrode and a channel region extending between the source electrode and the drain electrode that are located on the substrate; and a ferroelectric layer and a gate electrode stacked on the channel region. It should be noted that there may be no other semiconductor layers between the channel region and the ferroelectric layer, or the first interface layer described above may be provided between the channel region and the ferroelectric layer, and the second interface layer may be provided between the ferroelectric layer and the gate electrode, or the ferroelectric layer and the channel region may be in direct contact. Therefore, the memory cell here may be the structure described in any of the embodiments in FIG. 1 to FIG. 3. The writing method for the fusion memory in this embodiment includes:

applying a first voltage between the gate electrode and the bulk of at least one memory cell, wherein the first voltage is smaller than the inversion voltage that enables the polarization inversion of the ferroelectric layer; and setting the source electrode and the gate electrode to be grounded or in a floating state.

Figure 5:
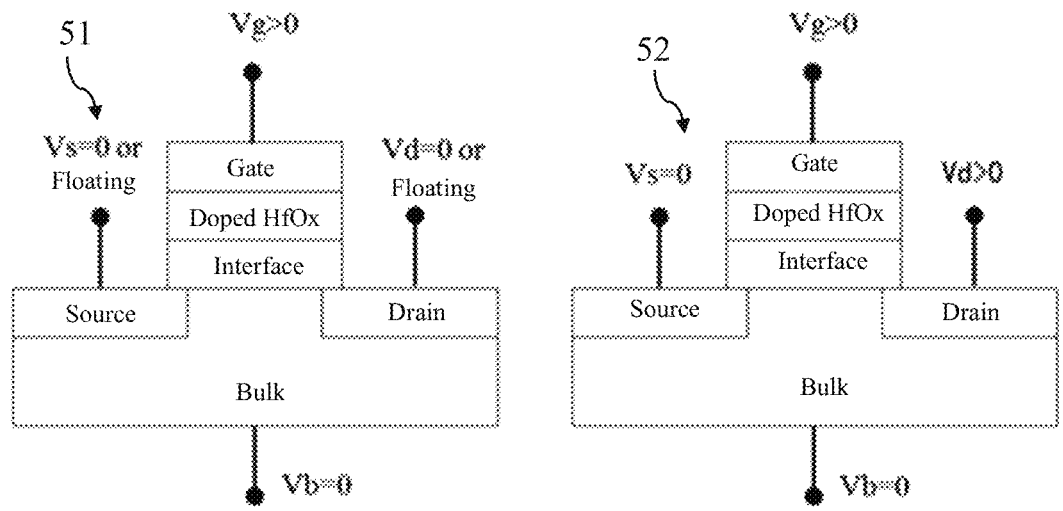
FIG. 5 is a schematic diagram of a writing method for a fusion memory according to some embodiments of the present disclosure.

FIG. 5 is a schematic diagram of a writing method for a fusion memory according to some embodiments of the present disclosure. As shown at 51 in FIG. 5, the source electrode and the drain electrode of the memory cell are maintained at zero potential (such as grounded) or in the floating state, and the bulk is maintained at zero potential (such as grounded). The first voltage is applied to the gate electrode, and the first voltage is smaller than the inversion voltage that enables the polarization inversion of the ferroelectric layer. The operating state may refer to the charge trapping mode in FIG. 4, which is performed in a low voltage interval (smaller than the inversion voltage). The application of the first voltage causes charging and discharging of electrons, and thereby causing a change in the threshold voltage. The change process is fast and may reach a programming speed of 20 ns, which is faster and has a lower voltage than a traditional DRAM.

Figure 7A:
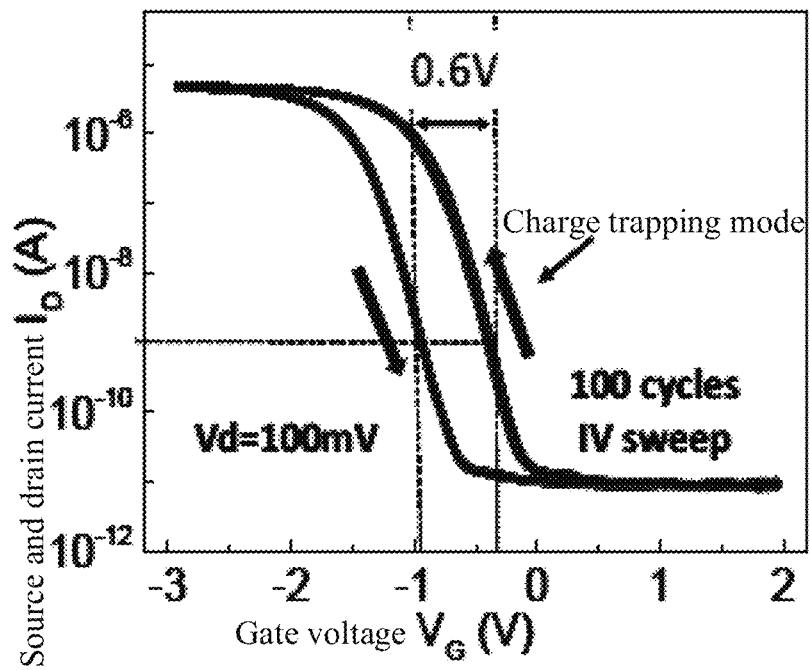
FIG. 7A, FIG. 7B and FIG. 7C respectively show a voltage scan curve diagram, a write and erase diagram and a read diagram in a charge trapping mode of a fusion memory according to some embodiments of the present disclosure.
Figure 7B:
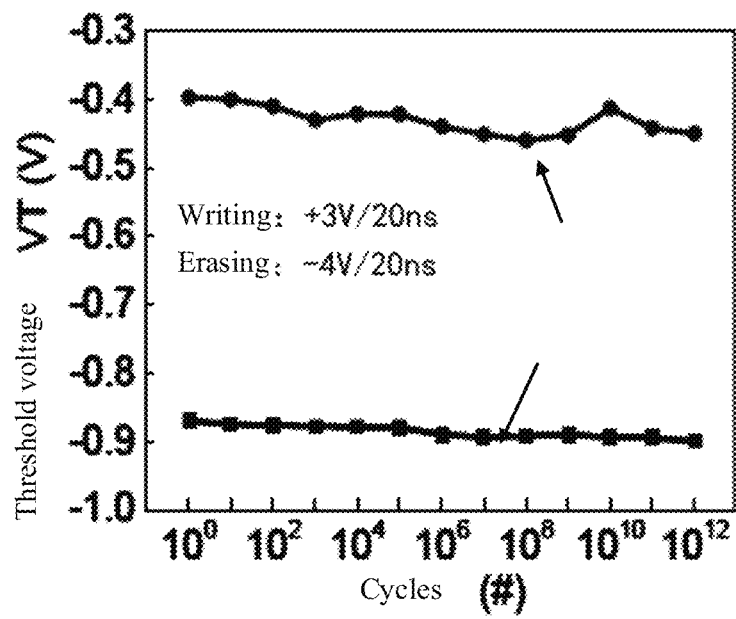
Figure 7C:
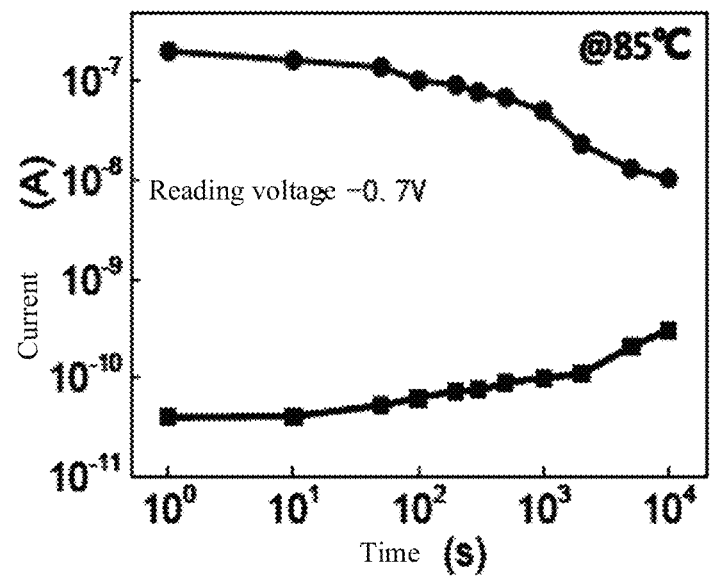

Further referring to FIG. 7A to FIG. 7C, as shown in FIG. 7A, when an electric field is applied to the memory cell (that is, a transistor containing a ferroelectric layer), a central atom in a crystal in the ferroelectric layer is maintained in a low energy state along the electric field. After the electric field is removed, the central atom is remained in the low energy state. When the first voltage is applied, there is no inversion in a ferroelectric domain (the first voltage is in a non-inversion voltage interval). As shown in FIG. 7B, a positive first voltage may be controlled to be 3V, and a pulse time is 20 nm. During this process, the threshold value changes, that is, data writing is achieved. Compared with the existing DRAM, as shown in FIG. 7B and FIG. 7C, after a cycle of more than $10^{12}$, the threshold voltage is still lower than that of the traditional DRAM, and it has a retention time of more than 1,000 seconds at 85° C. The speed is equivalent to that of DRAM, and the retention characteristics are significantly better than the DRAM in the related art.

In some embodiments, the writing method for the fusion memory may further include the writing method 52 illustrated in FIG. 5. A second voltage is applied between the gate electrode and the bulk of at least one memory cell, and the second voltage is greater than the inversion voltage that enables the polarization inversion of the ferroelectric layer. The source electrode is in a grounded state, and the gate electrode is in a positive voltage state. This operating state may refer to the ferroelectric inversion mode in FIG. 4, which is performed in a high voltage interval (greater than the reversal voltage). The application of the second voltage may cause the reversal of the ferroelectric domain. The programming voltage of this process is still less than that of the traditional FLASH, and the speed is also fast and may reach a programming speed of 20 ns.

Figure 8A:
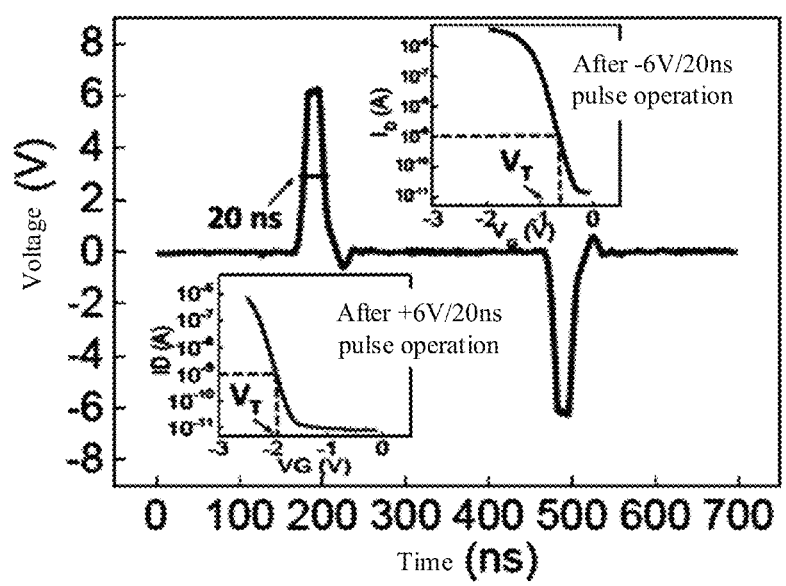
FIG. 8A, FIG. 8B and FIG. 8C respectively show a single-cycle operation diagram, a multi-cycle operation diagram and a write and erase diagram in a ferroelectric inversion mode of a fusion memory according to some embodiments of the present disclosure.
Figure 8B:
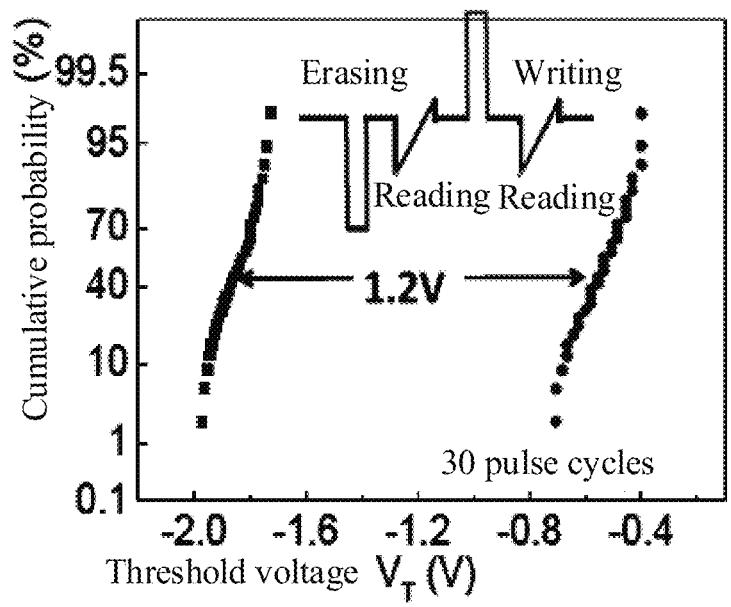
Figure 8C:
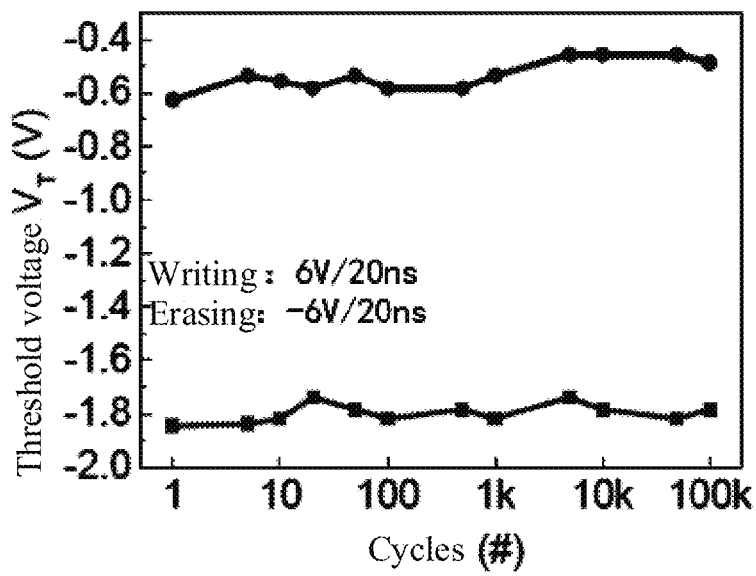

In some embodiments, for the application of the second voltage, referring to FIG. 8A to FIG. 8C, an electric field is applied to the memory cell (that is, a transistor containing a ferroelectric layer). When the second voltage is applied, the ferroelectric domain is inversed (the second voltage is greater than the inversion voltage). As shown in FIG. 8B, a positive second voltage may be controlled to be 6V, and a pulse time is 20 nm. During this process, the threshold value is changed, that is, the writing of data is achieved, and the ferroelectric domain inversion is generated at the same time. Compared with the existing FLASH, as shown in FIG. 8B and FIG. 8C, after a plurality of cycles, the threshold voltage is still smaller than that of the traditional FLASH, the retention time and the speed are equivalent to those of the FLASH, and a programming voltage is much smaller than that of the traditional FLASH.

In some embodiments, the writing method in this embodiment may further include reading the data written into the memory cell. For example, as shown in FIG. 7C, a small reading voltage (for example −0.7V) may be applied to achieve data reading, and the threshold voltage does not change.

Figure 6:
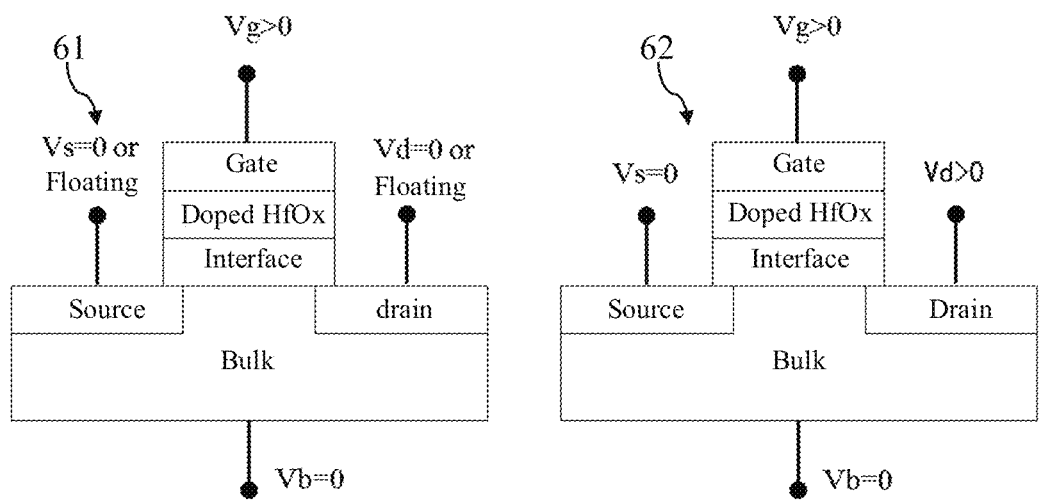
FIG. 6 is a schematic diagram of an erasing method for a fusion memory according to some embodiments of the present disclosure.

FIG. 6 is a schematic diagram of an erasing method for a fusion memory according to some embodiments of the present disclosure. As shown at 61 in FIG. 6, the source electrode and the drain electrode of the memory cell are maintained at zero potential (such as grounded) or in a floating state, and the bulk is maintained at zero potential (such as grounded). A third voltage with a negative value is applied to the gate electrode, and an absolute value of the third voltage is less than the inversion voltage that enables the polarization inversion of the ferroelectric layer. The operating state may refer to the charge trapping mode in FIG. 4, which is performed in a low voltage interval (smaller than the inversion voltage). The application of the third voltage may cause charging and discharging of electrons and thereby causing a change in the threshold voltage. The change process is fast and may reach an erasing speed of 20 ns, which is faster and has a lower voltage than a traditional DRAM.

Further referring to FIG. 7A to FIG. 7C, as shown in FIG. 7A, when an electric field is applied to the memory cell (that is, a transistor containing a ferroelectric layer), a central atom in a crystal in the ferroelectric layer is maintained in a low energy state along the electric field. After the electric field is removed, the central atom is remained in the low energy state. When the third voltage is applied, no inversion is generated in a ferroelectric domain (the third voltage is in the non-inversion voltage interval). As shown in FIG. 7B, a positive third voltage may be controlled to be −4V, and a pulse time is 20 nm. During this process, the threshold value changes, that is, data erasing is achieved. Compared with the existing DRAM, as shown in FIG. 7B and FIG. 7C, after a cycle of more than $10^{12}$, the threshold voltage is still lower than that of the traditional DRAM, and it has a retention time of more than 1,000 seconds at 85° C. The speed is equivalent to that of DRAM, and the retention characteristics are significantly better than the traditional DRAM.

In some embodiments, the erasing method for the fusion memory may further include an erasing manner shown at 62 in FIG. 6. A fourth voltage is applied between the gate electrode and the bulk of at least one memory cell, and an absolute value of the fourth voltage is greater than the reversal voltage that enables the polarization reversal of the ferroelectric layer. Furthermore, the bulk is at zero voltage (such as grounded state), the gate electrode is in a negative voltage state, the drain electrode is in a grounded or floating state, and the source electrode is in a positive voltage state. This operating state may refer to the ferroelectric reversal mode in FIG. 4, which is performed in a high voltage interval (greater than the reversal voltage). The application of the fourth voltage may cause the ferroelectric domain reversal. The erasing voltage of this process is still less than that of the traditional FLASH, and the speed is also fast and may reach an erasing speed of 20 ns.

In some embodiments, for the application of the fourth voltage, referring to FIG. 8A to FIG. 8C, an electric field is applied to the memory cell (that is, a transistor containing a ferroelectric layer). When the fourth voltage is applied, an inversion is generated in the ferroelectric domain (the absolute value of the fourth voltage is greater than the inversion voltage). As shown in FIG. 8B, a negative fourth voltage may be controlled to be −6V, and a pulse time is 20 nm. During this process, the threshold value is changed, that is, the data erasing is achieved, and the ferroelectric domain inversion is generated at the same time. Compared with the existing FLASH, as shown in FIG. 8B and FIG. 8C, after a plurality of cycles, the threshold voltage is still smaller than that of a traditional FLASH, a retention time and a speed are equivalent to those of the FLASH, and an erasing voltage is much smaller than that of the traditional FLASH.

According to yet another aspect of the embodiments of the present disclosure, there is provided a memory including a plurality of memory cells. Each memory cell includes a deep-level defect dielectric layer that enables the memory cell to operate in a charge trapping mode. Therefore, the memory has the function of DRAM, while the operating voltage is much smaller than that of the traditional DRAM, and storage speed and erasing speed are fast.

Figure 9A:
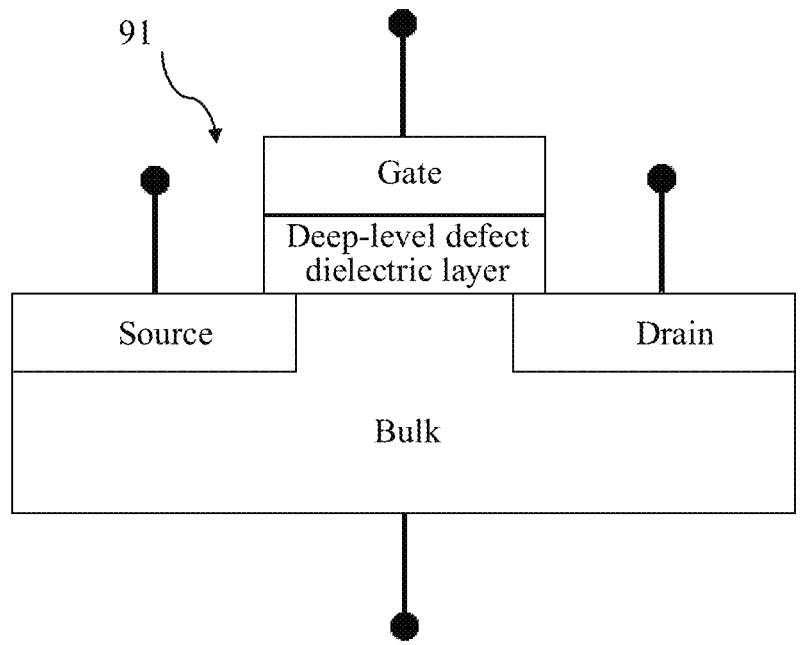
FIG. 9A to FIG. 9C respectively show schematic cross-sectional views of memory cells of three types of memories according to the embodiments of the present disclosure.

FIG. 9A is a schematic cross-sectional view of a memory cell in a fusion memory according to some embodiments of the present disclosure. FIG. 9 shows a fusion memory including a plurality of memory cells 91. Each memory cell 91 includes: a bulk substrate; a source electrode and a drain electrode as well as a channel region extending between a source region and a drain region, that are located on the bulk substrate; a deep-level defect dielectric layer on the channel region; and a gate electrode on the deep-level defect dielectric layer.

The memory cell in this embodiment includes the channel region and the deep-level defect dielectric layer on the channel region, which are in direct contact. By adjusting a voltage applied to the gate electrode, the deep-level defect dielectric layer may operate in a charge trapping mode and a polarization inversion mode.

The deep-level defect dielectric layer in FIG. 9A is used as a gate dielectric between the gate electrode and the channel region. A large number of lattice defects in a material of the deep-level defect dielectric layer may be used for charge storage, so that the memory may operate in the charge trapping mode, and data may be stored by trapping and releasing charges.

The deep-level defect dielectric layer mentioned in the embodiments of the present disclosure refers to a dielectric layer material with a charge trap energy level of 1 eV or more, such as SiN, a ferroelectric material, and the like.

In some embodiments, a material of the deep-level defect dielectric layer may contain doped $HfO_x$, $ZrO_x$, PZT, BFO or BST, preferably $HfO_x$. A dopant may be Si, Zr, Hf, Al, Y, Gd, La, Sr, Ti, and/or N, etc., preferably Zr. A doping content is between 10% and 75%.

In some embodiments, the deep-level defect dielectric layer has a thickness of 3 nm to 10 nm. The channel has a length of 5 nm to 200 nm, and a width of 5 nm to 500 nm.

In some embodiments, the bulk, the source electrode, the drain electrode and the gate electrode described above may be configured according to the existing memory cell arrangements, and the corresponding preparation process may also be performed with reference to the existing process flows and participations.

In some embodiments, the fusion memory may further include a control circuit, and a gate control sub-circuit connected to each memory cell and configured to separately apply a specific first voltage to the gate electrode, so that the deep-level defect dielectric layer under the gate electrode may trap electrons and the threshold voltage may be changed during charging or discharging. The control circuit may also be integrated in a read-write circuit of the memory, so as to control a corresponding voltage pulse value during the read-write process. The read-write circuit may write the content into an accessed memory cell at the first voltage or read information from the accessed memory cell according to the read-write instructions of the CPU. An absolute value of the first voltage should be smaller than an inversion voltage value that enables the polarization inversion of the deep-level defect dielectric material in the deep-level defect dielectric layer. With the increase of the first voltage, the deep-level defect dielectric layer traps more electrons, and the threshold voltage of the memory cell may gradually increase.

In some embodiments, according to the requirements of the memory product, the source electrode and the drain electrode may be kept in a floating state, or adjusted to a corresponding state (positive voltage, negative voltage, or grounded) according to an operating state of the memory (writing, erasing, or reading). The specific adjustment method may refer to the above embodiment of the writing method for the fusion memory.

In some embodiments, the memory cell array in the fusion memory of the embodiments of the present disclosure may be configured by using word line, bit line and source line architecture known in the related art. The word line is coupled to the gate electrode of the corresponding memory cell, the bit line is coupled to the drain electrode of the corresponding memory cell, and the source line is coupled to the source electrode of the corresponding memory cell.

In some embodiments, the fusion memory of the embodiments of the present disclosure may further include a read circuit used to read information stored in each memory cell. The read circuit may read the information stored in the memory cell by applying a small reading voltage (for example, −0.7V, 0V or 0.7V) in the polarization inversion of the deep-level defects or in the electron trapping mode of the deep-level defect dielectric layer.

Figure 9B:
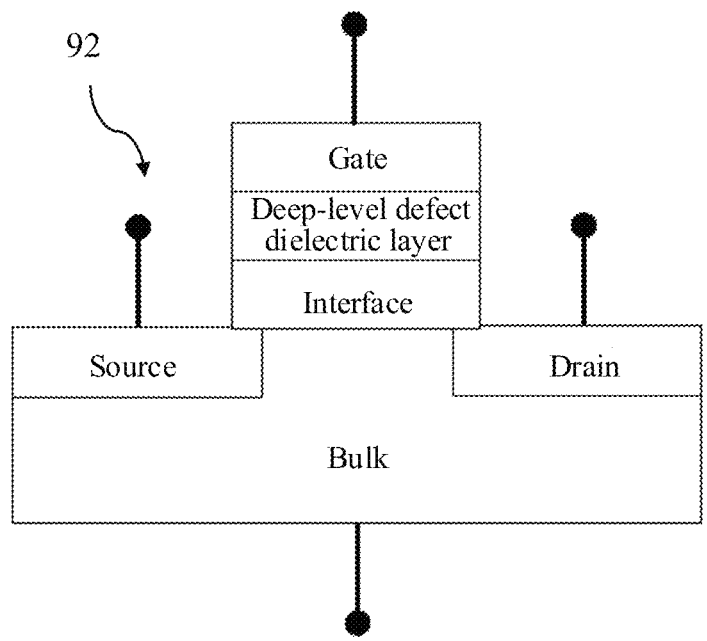

FIG. 9B is a schematic cross-sectional view of a memory cell in another fusion memory according to some embodiments of the present disclosure. FIG. 9B shows a fusion memory including a plurality of memory cells 92. Each memory cell 92 includes: a bulk substrate; a source electrode and a drain electrode as well as a channel region extending between a source region and a drain region, that are located on the bulk substrate; a first interface layer on the channel; a deep-level defect dielectric layer on the first interface layer; and a gate electrode on the deep-level defect dielectric layer.

The memory cell in this embodiment has a structure similar to that in FIG. 9A, except that the first interface layer is provided between the deep-level defect dielectric layer and the channel region. The first interface layer may be used to control a growth of a deep-level defect material, such as lattice orientation control or defect distribution.

In some embodiments, a material of the first interface layer may contain $SiO_2$, SiN, SiON, $AlO_x$, $TiO_2$, $HfO_x$ or a combination thereof. Preferably, the material of the first interface layer may contain $SiO_2$. The first interface layer may have a thickness of 0.3 nm to 3 nm. The material of the first interface layer may be adjusted according to the deep-level defect dielectric layer material to be grown. For example, when the deep-level defect dielectric layer material contains $HfO_x$, the corresponding first interface layer material may contain SiON. For another example, when the deep-level defect dielectric layer material contains SBT or PZT, the corresponding first interface layer material may contain $HfO_x$ or $AlO_x$.

Figure 9C:
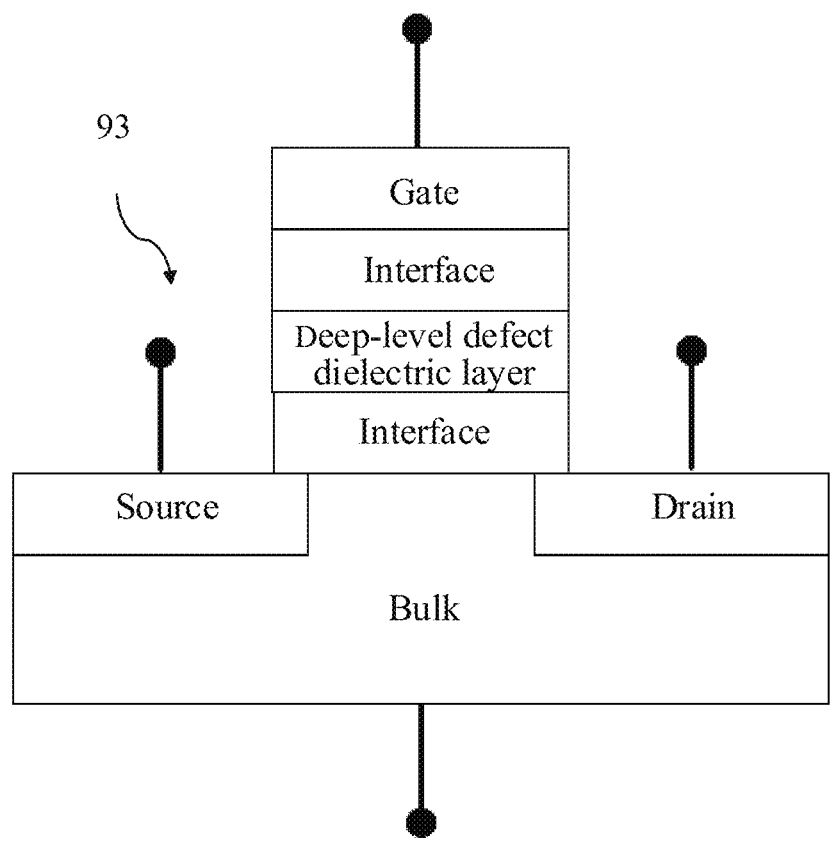

FIG. 9C is a schematic cross-sectional view of a memory cell in yet another fusion memory according to some embodiments of the present disclosure. FIG. 9C shows a fusion memory including a plurality of memory cells 93. Each memory cell 93 includes: a bulk substrate; a source electrode and a drain electrode as well as a channel region extending between a source region and a drain region, that are located on the bulk substrate; a first interface layer on the channel; a deep-level defect dielectric layer on the first interface layer; a second interface layer on the deep-level defect dielectric layer; and a gate electrode on the second interface layer.

The memory cell in this embodiment has a structure similar to that in FIG. 9A, except that the first interface layer is provided between the deep-level defect dielectric layer and the channel region, and the second interface layer is provided between the deep-level defect dielectric layer and the gate electrode. The first interface layer may be used to control a growth of the deep-level defect material, such as lattice orientation control or defect distribution. The second interface layer is used to isolate a mutual diffusion and an interface damage between a metal gate and the deep-level defect dielectric layer.

In some embodiments, a material of the first interface layer may contain $SiO_2$, SiN, SiON, $AlO_x$, $TiO_2$, $HfO_x$ or a combination thereof. Preferably, the material of the first interface layer may contain $SiO_2$. The first interface layer may have a thickness of 0.3 nm to 3 nm. The material of the first interface layer may be adjusted according to the deep-level defect dielectric layer material to be grown. For example, when the deep-level defect dielectric layer material contains $HfO_x$, the corresponding first interface layer material may contain SiON. For another example, when the deep-level defect dielectric layer material contains SBT or PZT, the corresponding first interface layer material may contain $HfO_x$ or $AlO_x$.

In some embodiments, a material of the second interface layer may contain $SiO_2$, SiN, SiON, $AlO_x$, $TiO_2$ or $HfO_x$. Preferably, the material of the second interface layer may contain $AlO_x$. The second interface layer may have a thickness of 1 nm to 10 nm. The material of the second interface layer may be adjusted according to the material of the deep-level defect dielectric layer and the material of the gate electrode. For example, when the deep-level defect dielectric layer material contains $HfO_x$, the corresponding second interface layer material may be a $SiO_2$/SiN/$SiO_2$ stack. For another example, when the deep-level defect dielectric layer material contains SBT or PZT, the corresponding first interface layer material may contain $HfO_x$ or $AlO_x$.

The operating principle of the memory cell in the fusion memory of the above embodiments may be referred to in the charge trapping mode as shown in FIG. 4. FIG. 4 is a schematic diagram of a principle of the fusion memory implemented in the present disclosure. As shown in FIG. 4, in the charge trapping mode, when the gate voltage $V_G$ gradually increases, the threshold voltage $V_T$ also gradually increases. At point A, the scanning voltage is −5V, and the corresponding threshold voltage $V_T$ is about −1.5V. When the scanning voltage gradually increases and turns to a positive value, such as 1V at point B, the threshold voltage $V_T$ is about −1.1V. Compared with point A, the threshold value increases. Similarly, at point C and point D, the memory is also in the charge trapping mode.

According to the content of another embodiment of the present disclosure, there is provided a neural network operation device, including:
an operation array including operation units, wherein each operation unit includes: a source terminal, a drain terminal, a gate electrode, and a threshold voltage adjustment layer under the gate electrode;
wherein the gate electrodes of each column of operation units of the operation array are connected together, and each column is used to determine a weight value according to a threshold voltage adjusted by the threshold voltage adjustment layer; and wherein the threshold voltage adjustment layer is a ferroelectric layer.

Figure 10:
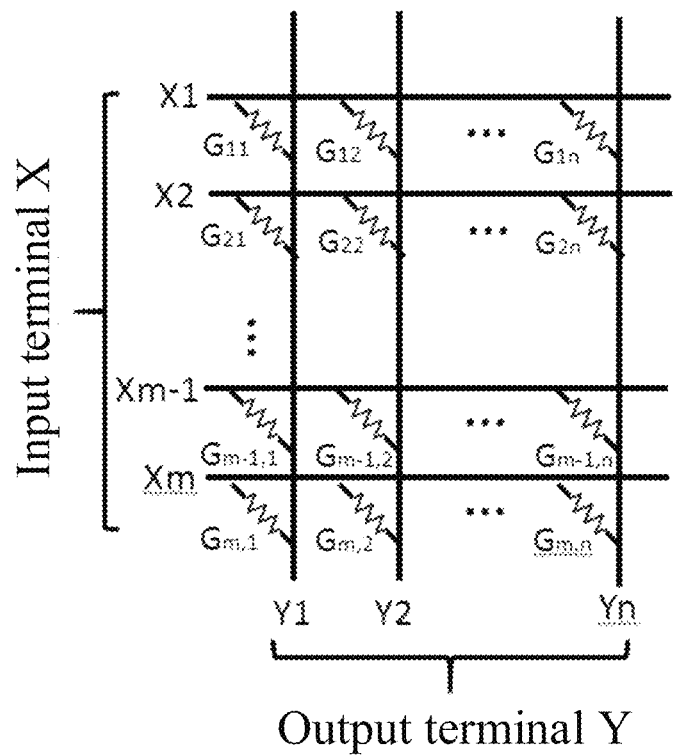
FIG. 10 is a schematic diagram of a principle of a neural network operation device.
Figure 11:
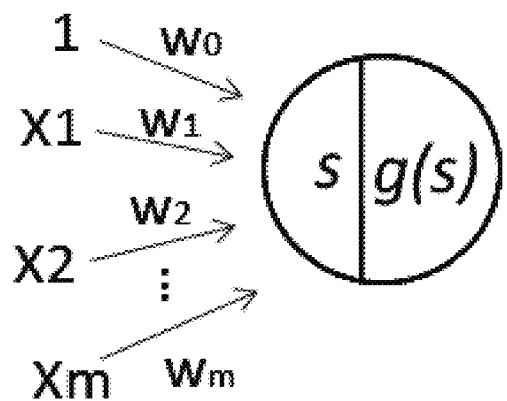
FIG. 11 is a schematic diagram of neuron composition.

Firstly, as shown in FIG. 10, in a neural network operation device, a traditional synapse device is simulated by a two-terminal memristor or a three-terminal transistor. The synapse devices are generally connected to each other in a parallel NOR structure. After weight training, the operation is performed by way of current convergence. Combining FIG. 10 and FIG. 11, a current value at an output terminal Y: $Y_n = \Sigma_m X_m \times G_m$ is the product of a voltage value at an input terminal X multiplied by the weight value (conductance) of the corresponding cross-endpoint synapse $Y = X \times G$.

As shown in FIG. 10, if the current generated at each endpoint is 10 µA, the maximum number of parallel inputs X is about hundreds of orders of magnitude (the maximum value of the current at the Y endpoint at the summary is about several mA). If the current generated at each endpoint is 1 µA, the maximum number of parallel inputs X is about thousands of orders of magnitude. The problem with this connection method is that the training power consumption is large and the number of parallels is limited. This type of structure has problems such as large operating current and large training consumption, which limits the number of parallels.

Figure 12:
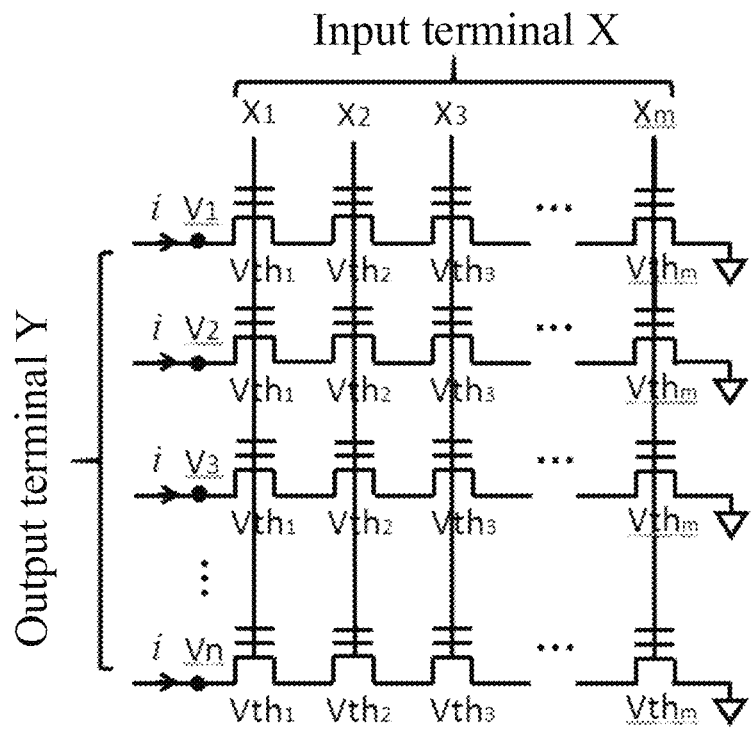
FIG. 12 is a schematic diagram of a principle of a neural network operation device according to some embodiments of the present disclosure.

Based on the above description, as shown in FIG. 12, the neural network operation device proposed by the embodiments of the present disclosure includes an operation array, wherein the operation unit summarized in the array includes a threshold voltage adjustment layer that is a ferroelectric layer.

Figure 13:
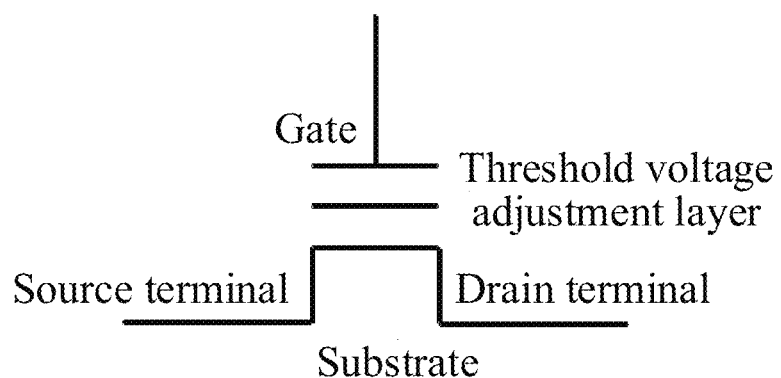
FIG. 13 is a schematic diagram of a memory cell in the neural network operation device in FIG. 12.

As shown in FIG. 13, the operation array includes operation units. Each operation unit includes: a source terminal, a drain terminal, a gate electrode, a threshold voltage adjustment layer under the gate electrode, and a channel region extending between a source region and a drain region. The threshold voltage adjustment layer is located on the channel region. The gate electrodes of each column of operation units of the operation array are connected together, and each column is used to adjust a weight value according to a threshold voltage adjusted by the threshold voltage adjustment layer. The threshold voltage adjustment layer is a ferroelectric layer. FIG. 13 shows a three-terminal threshold adjustment synapse device. The threshold voltage may be adjusted through an adjustment layer, so that the source/drain resistance may be adjusted and used for the synapse in the neural network.

In FIG. 12, each row of operation units (synapses) are connected in series. X is an input terminal, and the weight training is achieved by applying a voltage to the X terminal. The current during training is mainly a drain current at the Gate terminal (in the order of pA), and the power consumption is small. Optionally, the threshold voltage of the operation unit in a $n_{th}$ row and $m_{th}$ column may be determined by simultaneously applying voltages to the $m_{th}$ column of the input terminal X and the $n_{th}$ row of the array, that is, the threshold voltage of the operation cell is adjusted jointly to achieve the weight input of a specific row and column. After training, a voltage value $V_n$ is read by applying a fixed current i to each row. The magnitude of $V_n$ is proportional to a sum of each row of synapse resistance values in series. The read current value of the structure is a constant value, and the number of parallels is not limited, which is conducive to building an ultra large scale neural network.

$$V_n = \sum_m i \times R_m = \sum_m \frac{i}{\beta(X_m - Vth_m)}$$

In the above equation, $V_n$ represents a total output voltage of the $n_{th}$ row, i takes a value from 1 to m, $R_m$ represents the current of the $n_{th}$ row and $m_{th}$ column, and β represents a transconductance of the transistor; $X_m$ represents the input of the gate electrode of the $m_{th}$ column (corresponding to the input value of the neural network), and $Vth_m$ represents the threshold voltage of the operation unit in the $m_{th}$ column and the $n_{th}$ row.

In some embodiments, the gate electrodes of each column of the operation array are used to input the value for operation, and the operation units in each row of the operation array are connected in series to output an output value of the each row of operation units after respective operations.

In some embodiments, each row of operation units are further connected in series with a summation circuit used to sum operation results of each cell, so as to form an output voltage value. That is, the outputs $i \times R_m$ of the drain electrodes in the above equation are summed to obtain $V_n$.

In some embodiments, each summation circuit further includes an analog-to-digital conversion circuit at a back end, and the analog-to-digital conversion circuit is used to convert the output voltage value of each row into an output value of a corresponding digital signal.

In some embodiments, the ferroelectric layer material may contain doped $HfO_x$, $ZrO_x$, PZT, BFO or BST.

In some embodiments, each operation unit in the operation array is constructed in a 3D stacking manner.

In some embodiments, the absolute value of the voltage applied to the gate electrodes of each operation unit is configured to be greater than the inversion voltage that enables the polarization inversion of the ferroelectric layer.

Figure 14:
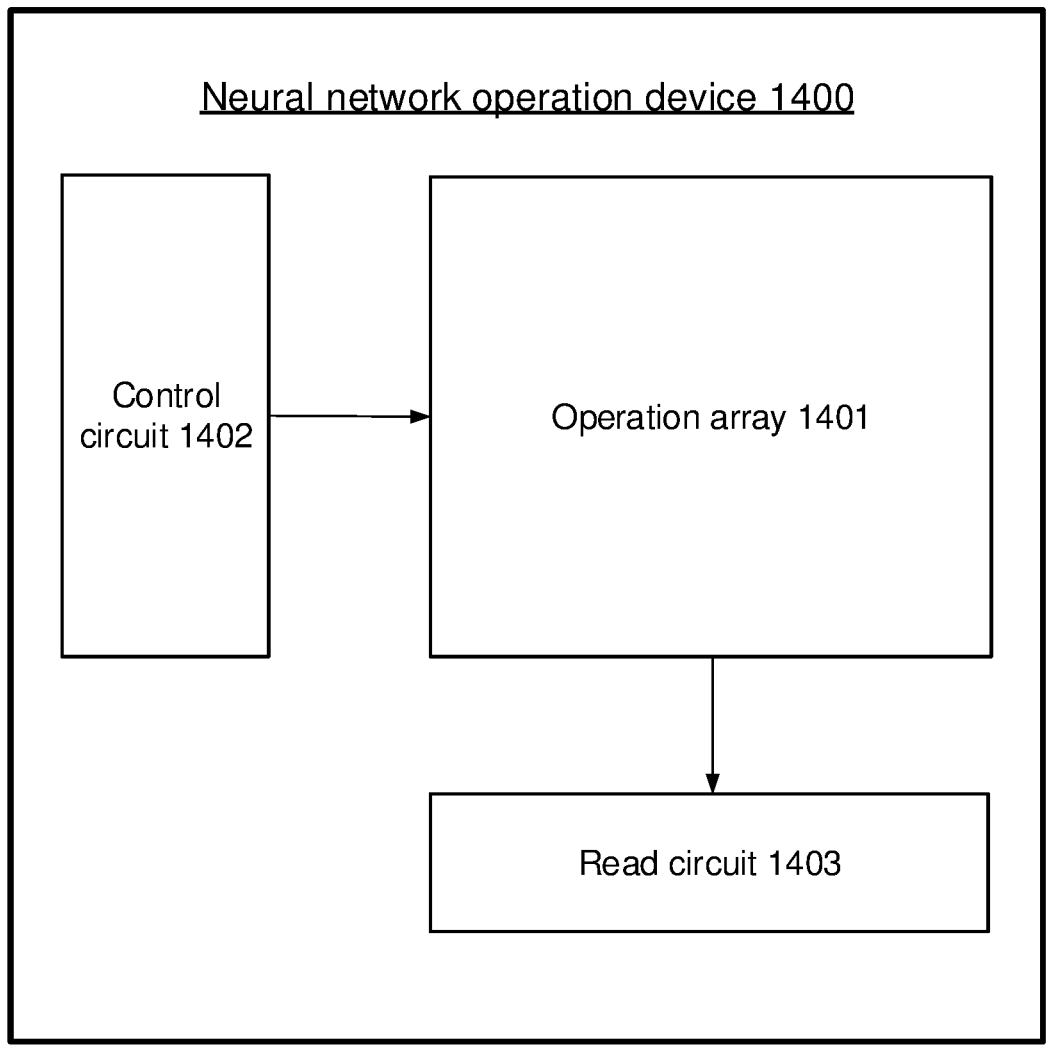
FIG. 14 is a block diagram of a neural network operation device according to some embodiments of the present disclosure.

FIG. 14 is a block diagram of a neural network operation device according to some embodiments of the present disclosure. As shown in FIG. 14, a typical neural network operation device 1400 may include an operation array 1401, a control circuit 1402, and a read circuit 1403. The control circuit 1402 may control the operation array to input an operation unit weight value in the array and perform training adjustment of the weight value (by controlling the voltage at the gate electrode of the column where the operation unit is located and/or the voltage of the row where the operation unit is located), so as to control to perform the neural network operation (by inputting the voltage corresponding to the input value in the neural network at the X terminal), and control to read the neural network operation result (input a read current at the source terminal, output a total current/voltage at ends of each row of operation units connected in series, determine the corresponding value through a summation circuit and an analog-to-digital conversion circuit, and output the corresponding value to the read circuit 1403).

In the mechanism of the neural network operation device of the present disclosure, a current value read subsequent to the neural network operation is a constant value, and the number of parallels is not limited, which is conducive to building an ultra large scale neural network.

The neural network operation device of the present disclosure may be implemented to simultaneously achieve operation and storage functions, so that an overall operation efficiency may be improved.

Although many details are described in the present disclosure, these should not be construed as limiting the scope of the present disclosure, but as a description of specific features of specific embodiments. Certain features described in the present disclosure in the context of individual embodiments may also be implemented in combination in a single embodiment. Conversely, various features described in the context of a single embodiment may also be implemented in a plurality of embodiments individually or in any suitable sub-combination. Furthermore, although the above may describe features as acting in certain combinations and even as stated in the scope of the original claims, in some cases, one or more features may be deleted from the required combination, and the claimed combination may be for sub-combinations or variations of the sub-combinations. Similarly, although operations are described in a specific order in the drawings, this should not be construed as being required to perform such operations in the specific order shown or in a sequential order, or should not be construed as being required to perform all the operations shown to achieve the desired result.

The above-described specific embodiments have described in detail the purposes, technical solutions and advantages of the present disclosure. It should be noted that the above are only specific embodiments of the present disclosure and are not intended to limit the present disclosure. Any modification, equivalent substitution, improvement, etc., made within the spirit and scope of the present disclosure should be included within the scope of the present disclosure.

What is claimed is:

1. A neural network operation device, comprising:
an operation array comprising operation units, wherein each operation unit comprises: a source terminal, a drain terminal, a gate electrode, a threshold voltage adjustment layer under the gate electrode, and a channel region extending between a source region and a drain region, the threshold voltage adjustment layer is located on the channel region;
wherein the gate electrodes of each column of operation units of the operation array are connected together, and each column is configured to adjust a weight value according to a threshold voltage adjusted by the threshold voltage adjustment layer; and
wherein the threshold voltage adjustment layer is a ferroelectric layer,
wherein the device further comprises a control circuit configured to control a voltage applied to the gate electrode, the voltage applied to the gate electrode comprises a first voltage and a second voltage, so that the ferroelectric layer operates in a charge trapping mode and a polarization inversion mode, and wherein an absolute value of the first voltage is smaller than an inversion voltage value that enables a polarization inversion of a ferroelectric material in the ferroelectric layer, and an absolute value of the second voltage is greater than an inversion voltage value that enables a polarization inversion of a ferroelectric material in the ferroelectric layer.

2. The device of claim 1, wherein the gate electrodes in each column of the operation array are configured to input a value for operation, the operation units in each row of the operation array are connected in series, and each row of operation units is configured to output an output value generated by operations of the operation units in each row.

3. The device of claim 2, wherein each row of operation units are further connected in series with a summation circuit, the summation circuit is configured to sum operation results of each operation unit, so as to form an output voltage value.

4. The device of claim 3, wherein each row of summation circuits further comprises an analog-to-digital conversion circuit at a back end, and the analog-to-digital conversion circuit is configured to convert the output voltage value into an output value of a corresponding digital signal.

5. The device of claim 1, wherein a material of the ferroelectric layer contains doped $HfO_x$, $ZrO_x$, PZT, BFO or BST.

6. The device of claim 1, wherein each operation unit in the operation array is constructed in a 3D stacking manner.

7. The device of claim 1, wherein each row of operation units in the operation array are connected in series, and voltages are respectively input in a set row and a set column of the operation array, so as to jointly determine a threshold voltage of the operation unit in the set row and the set column.

8. The device of claim 1,
wherein the control circuit is electrically connected to the operation array and configured to control a weight writing, a neural network operation, and/or an output of a neural network operation result in the operation array.

9. The device of claim 8, further comprising:
a read circuit configured to read the neural network operation result.

\* \* \* \* \*